United States Patent
Yu et al.

(10) Patent No.: US 12,544,846 B2
(45) Date of Patent: Feb. 10, 2026

(54) FIXING APPARATUS

(71) Applicant: Samsung Electronics Co., Ltd., Suwon-si (KR)

(72) Inventors: Bongken Yu, Suwon-si (KR); Cheolsoo Han, Suwon-si (KR); Kwangjin Bae, Suwon-si (KR); Youngjin Jang, Suwon-si (KR); Inwook Jung, Suwon-si (KR); Minchul Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 37 days.

(21) Appl. No.: 18/227,697

(22) Filed: Jul. 28, 2023

(65) Prior Publication Data

US 2024/0071983 A1 Feb. 29, 2024

(30) Foreign Application Priority Data

Aug. 30, 2022 (KR) .......................... 10-2022-0109271

(51) Int. Cl.
*H01L 23/00* (2006.01)
*B23K 3/06* (2006.01)

(52) U.S. Cl.
CPC ............ *H01L 24/75* (2013.01); *B23K 3/0623* (2013.01); *H01L 2224/75804* (2013.01)

(58) Field of Classification Search
None
See application file for complete search history.

(56) References Cited

U.S. PATENT DOCUMENTS

| | | |
|---|---|---|
| 6,607,117 B1 | 8/2003 | Kang et al. |
| 2003/0213832 A1 | 11/2003 | Kang et al. |

FOREIGN PATENT DOCUMENTS

| | | | | |
|---|---|---|---|---|
| JP | 6861602 B2 | * | 4/2021 | |
| JP | 6990102 B2 | | 1/2022 | |
| KR | 1020050001049 A | | 1/2005 | |
| KR | 20060024875 A | * | 3/2006 | |
| KR | 1020060024875 A | | 3/2006 | |
| KR | 101574124 B1 | | 12/2015 | |
| KR | 101613121 B1 | | 4/2016 | |
| KR | 102158819 B1 | * | 9/2020 | ....... H01L 21/67712 |
| KR | 1020220052766 A | | 4/2022 | |
| WO | WO-2019124234 A1 | * | 6/2019 | ............. H05K 13/04 |

* cited by examiner

*Primary Examiner* — Devang R Patel
(74) *Attorney, Agent, or Firm* — Muir Patent Law, PLLC

(57) ABSTRACT

A solder ball attaching apparatus includes a working die, having an internal space maintained in a vacuum state, and a plurality of lifting members installed on the working die to be movable upwardly and downwardly. The working die may be provided with an upper plate on which the lifting members are installed. The upper plate may be provided with an insertion groove, into which an upper end portion of the lifting member is inserted when the lifting member is lowered, and a locking groove into which a lower end portion of the lifting member is inserted when the lifting member is raised. The lifting member may be lowered by a chip when the chip is seated on the lifting member and may be raised by elastic restoring force when the chip is removed.

17 Claims, 9 Drawing Sheets

FIXING APPARATUS

CROSS-REFERENCE TO RELATED APPLICATION(S)

This application claims benefit of priority under 35 U.S.C. § 119 to Korean Patent Application No. 10-2022-0109271 filed on Aug. 30, 2022 in the Korean Intellectual Property Office, the disclosure of which is incorporated herein by reference in its entirety.

BACKGROUND

Aspects of the present disclosure relate to a solder ball attaching apparatus.

In general, when a process of attaching a chip to a board (PCB) is performed in a flip-chip process, an operation should be performed using a dummy chip even in a region in which no chip is installed. This is because there is a high risk that contamination of a working tool and/or a failure in positioning of a solder ball will occur during a solder ball attaching and sorting process, a subsequent process.

When a dummy chip is not provided, a defect may occur due to sagging of the board in a region, in which the dummy chip is not provided, during a process.

Accordingly, there is a need for development of a solder ball attaching apparatus for performing a solder ball attaching process, without occurrence of defects, even when no dummy chip is provided.

SUMMARY

Example embodiments provide a solder ball attaching apparatus for preventing contamination of a working tool and a failure in positioning of a solder ball, caused by warpage of a board, even when a solder ball attaching operation is performed on the board without providing a dummy chip.

According to an example embodiment, a solder ball attaching apparatus includes a working die having an internal space maintained in a vacuum state, and a plurality of lifting members installed on the working die to be movable upwardly and downwardly. The working die may be provided with an upper plate on which the lifting members are installed. The upper plate may be provided with an insertion groove, into which an upper end portion of the lifting member is inserted when the lifting member is lowered, and a locking groove into which a lower end portion of the lifting member is inserted when the lifting member is raised. The lifting member may be lowered by a chip when the chip is seated on the lifting member and may be raised by elastic restoring force when the chip is removed.

According to an example embodiment, a solder ball attaching apparatus includes a working die having an internal space maintained in a vacuum state, and a plurality of lifting members installed on the working die to be movable upwardly and downwardly by elastic force. The lifting member is provided with a flow path opened or closed according to raising or lowering of the lifting member to provide adsorption force through connection to the internal space of the working die maintained in the vacuum state.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
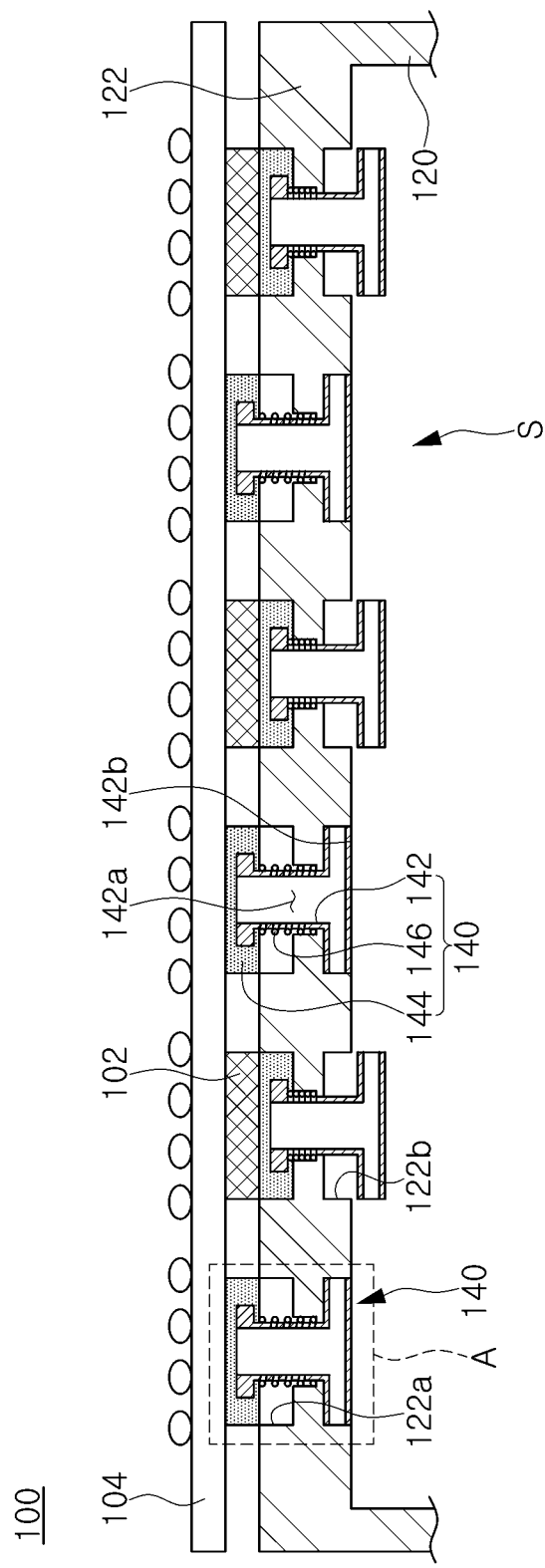
FIG. 1 is a view illustrating a configuration of a solder ball attaching apparatus according to an example embodiment.
Figure 2:
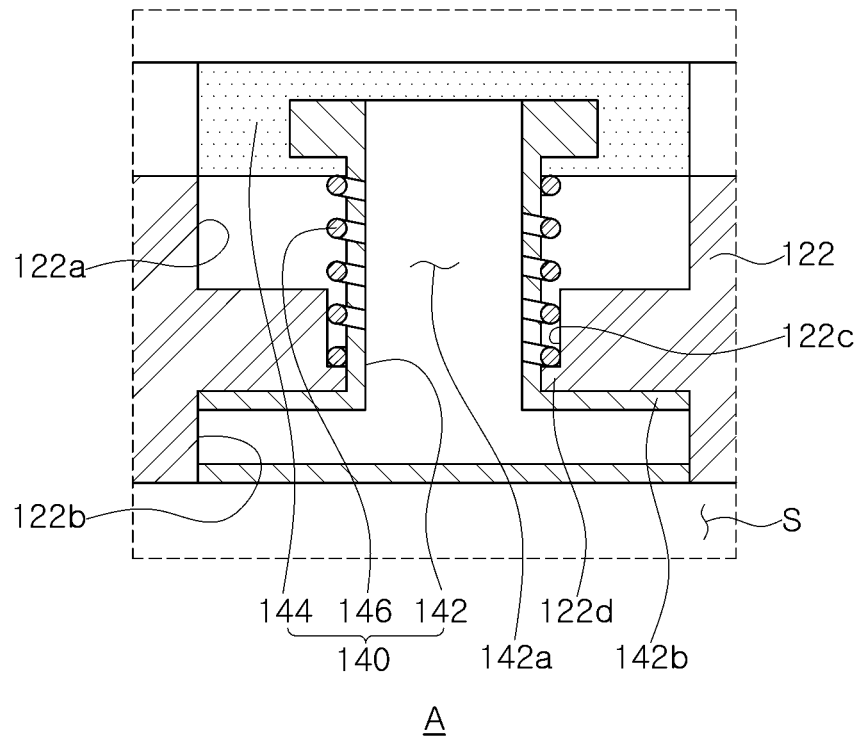
FIG. 2 is a view illustrating an enlarged configuration of a lifting member of a solder ball attaching apparatus according to an example embodiment.

FIG. 1 is a view illustrating a configuration of a solder ball attaching apparatus according to an example embodiment, and FIG. 2 is a view illustrating an enlarged configuration of a lifting member of a solder ball attaching apparatus according to an example embodiment.

Referring to FIGS. 1 and 2, a solder ball attaching apparatus 100 according to an example embodiment may include, for example, a working die 120 and a plurality of lifting members 140.

The working die 120 may have an internal space S. The internal space S of the working die 120 may be maintained in a vacuum state. When a chip 102 is seated on an upper plate 122 of the working die 120 through the vacuum formed in the internal space S of the working die 120, adsorption force may be provided to adsorb the chip 102. The plurality of lifting members 140 may be installed on the upper plate 122 of the working die 120. The upper plate 122 of the working die 120 may be provided with an insertion groove 122*a* and a locking groove 122*b* for installing the lifting member 140. As an example, the insertion groove 122*a* may be formed in an upper surface of the upper plate 122 and the locking groove 122*b* may be formed in a lower surface of the upper plate 122 to be disposed below the insertion groove 122*a*. As an example, a width and a depth of the locking groove 122*b* may be smaller than those of the insertion groove 122*a*. The insertion groove 122*a* and the locking groove 122*b* may be connected to each other through a communication hole 122*c*. Accordingly, the lifting member 140 may be driven at the upper plate 122 to be movable upwardly and downwardly. The depth of the insertion groove 122*a* may be the same as the thickness of the chip 102. This will be described in detail later.

The plurality of lifting members 140 may be installed on the working die 120. As an example, the lifting member 140 may be installed on the upper plate 122 of the working die 120 to be movable upwardly and downwardly. As an example, the lifting member 140 may include a body 142, a contact portion 144, and an elastic member 146.

The body 142 may be installed on the upper plate part 122 to be movable upwardly and downwardly, and may be provided with a flow path 142a such that the chip 102 may be fixed by the adsorption force through the vacuum of the internal space S of the working die 120. A lower end portion of the body 142 may be provided with a locking portion 142b inserted into the locking groove 122b of the upper plate 122 or spaced apart from the locking groove 122b. The flow path 142a may be opened to a side surface of the locking portion 142b. The flow path 142a, opened to the side surface of the locking portion 142b, may be closed when the locking portion 142b is inserted into the locking groove 122b and may be opened when the locking portion 142b is separated from the locking groove 122b. Accordingly, adsorption force for fixing the chip 102 may be provided or the internal space S of the working die 120 may be prevented from being connected to an external entity. For example, when the lifting member 140 fixes the chip 102, the lifting member 140 may fix the chip 102 using the vacuum state of the internal space S of the working die 120. In addition, when the lifting member 140 supports the board 104, the internal space S of the working die 120 may be prevented from being connected to an external entity. More specifically, when the lifting member 140 fixes the chip 102, the locking portion 142b may be spaced apart from the locking groove 122b to open the flow path 142a. Accordingly, the chip 102 may be fixed by the lifting member 140 through the vacuum state of the internal space S of the working die 120 while the flow path 142a is opened. In addition, when the lifting member 140 supports a lower surface of the board 104, the locking portion 142b may be disposed to be inserted into the locking groove 122b to close the flow path 142a. Accordingly, the internal space S of the working die 120 may be prevented from being connected to the external entity, allowing the vacuum state of the internal space S of the working die 120 to be maintained.

Figure 3:
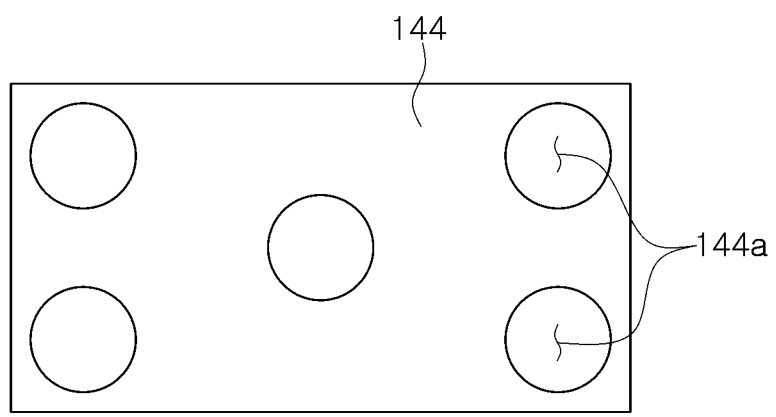
FIG. 3 is a plan view of a contact portion of a lifting member according to the example embodiment of FIG. 1 when viewed from above.

The contact portion 144 may be disposed in an upper end portion of the body 142. As illustrated in FIG. 3, the contact portion 144 may have a rectangular shape when viewed from above. In addition, the contact portion 144 may be inserted into the insertion groove 122a when the body 142 is lowered by the chip 102. To this end, the insertion groove 122a may have a shape corresponding to the shape of the contact portion 144, and the insertion groove 122a and the contact portion 144 may have sizes and shapes allowing the insertion groove 122a to be closed by the contact portion 144 when the contact portion 144 is inserted into the insertion groove 122a.

The contact portion 144 may be provided with a flow path hole 144a connected to the flow path 142a of the body 142. Accordingly, when the chip 102 is seated on the working die 120, the adsorption force may be provided through the flow hole 144a of the contact part 144, so that the chip 102 may be fixed to an upper surface of the contact portion 144.

As an example, the contact portion 144 may be formed of a material having elasticity. Accordingly, when the contact portion 144 supports a bottom surface of the chip 102 and a bottom surface of the board 104, scratches, or the like, may be prevented from occurring on the bottom surface of the chip 102 and the board 104, and the chip 102 and the board 104 may be supported more stably.

The elastic member 146 may serve to provide driving force for lifting the body 142. To this end, the elastic member 146 may have one end, supported on a locking projection 122d disposed in a lower end portion of the communication hole 122c, and the other end supported on a bottom surface of the contact portion 144. As an example, when the chip 102 is seated on the upper surface of the contact portion 144, the body 142 may be lowered and the chip 102 may be removed from the upper surface of the contact portion 144 while compressing the elastic member 146. In this case, the body may be raised by restoring force of the elastic member 146 while stretching the elastic member 146. As an example, the elastic member 146 may be formed of a coil spring. However, example embodiments are not limited thereto and any component may be used for the elastic member 146 as long as the component may provide driving force for lifting the body 142.

Since the depth of the insertion groove 122a is the same as the thickness of the chip 102, a height to which the lifting member 140 is lifted may be regulated by the depth of the insertion groove 122a, and thus the contact portion 144 of the lifting member 140 may more stably support the bottom surface of the board 104 when the lifting member 140 is raised.

As described above, the bottom surface of the board 104 may be supported through the lifting member 140 in a region in which the chip 102 is not installed, so that defects may be prevented from being occurring without use of a dummy chip.

Hereinafter, an operation of a chip soldering apparatus for an example embodiment will be described in detail with reference to accompanying drawings.

FIGS. 4 to 7 are views illustrating an operation of a chip soldering apparatus according to an example embodiment.

Figure 4:
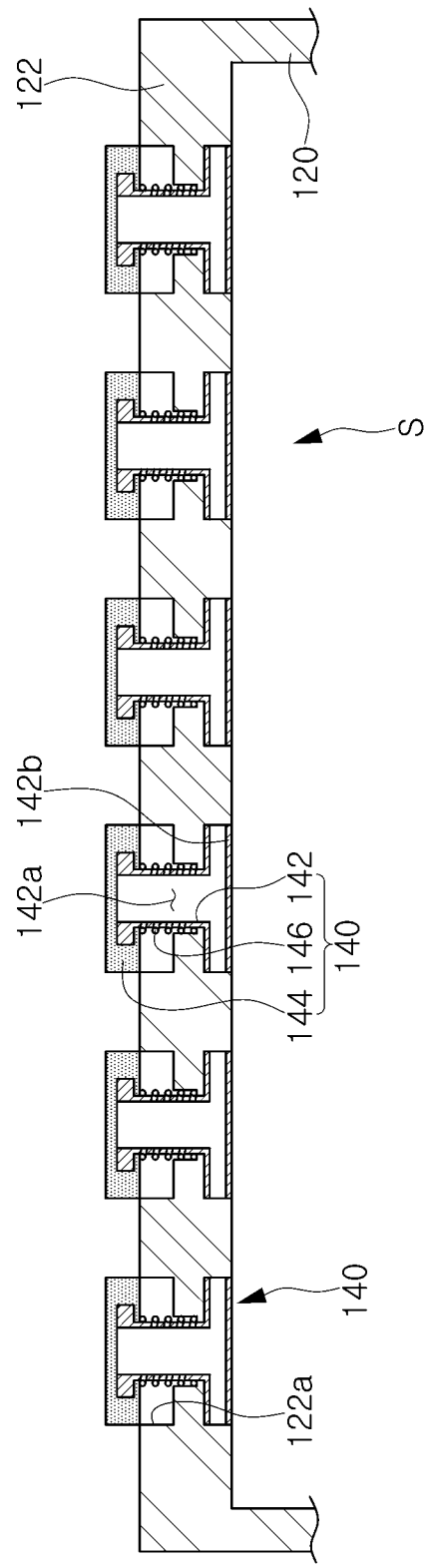
FIGS. 4 to 7 are views illustrating an operation of a chip soldering apparatus according to an example embodiment.

Referring to FIG. 4, when the chip 102 (see FIG. 5) is not seated on the working die 120 (i.e., the contact portion 144 of the lifting member 140), the lifting member 140 installed on the working die 120 may be disposed to protrude from the upper plate 122 of the working die 120. For example, as illustrated in FIG. 4, when the chip 102 is not seated on the contact portion 144 of the lifting member 140, the top surfaces of the contact portion 144 of the plurality of lifting members 140 are substantially coplanar with each other. A location, in which the lifting member 140 is disposed, will now be described in more detail. The elastic member 146 of the lifting member 140 may allow the contact portion 144 of the lifting member 140 to be spaced apart from the insertion groove 122a, formed in the upper plate 122 of the working die 120, while maintaining an original shape. In this case, the locking portion 142b provided on the body 142 of the lifting member 140 may be disposed to be inserted into the locking groove 122b of the upper plate 122. In addition, the flow path 142a opened to the side surface of the locking portion 142b may be closed by inserting the locking portion 142b into the locking groove 122b. Accordingly, the vacuum state formed in the internal space S of the working die 120 may be maintained. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Figure 5:
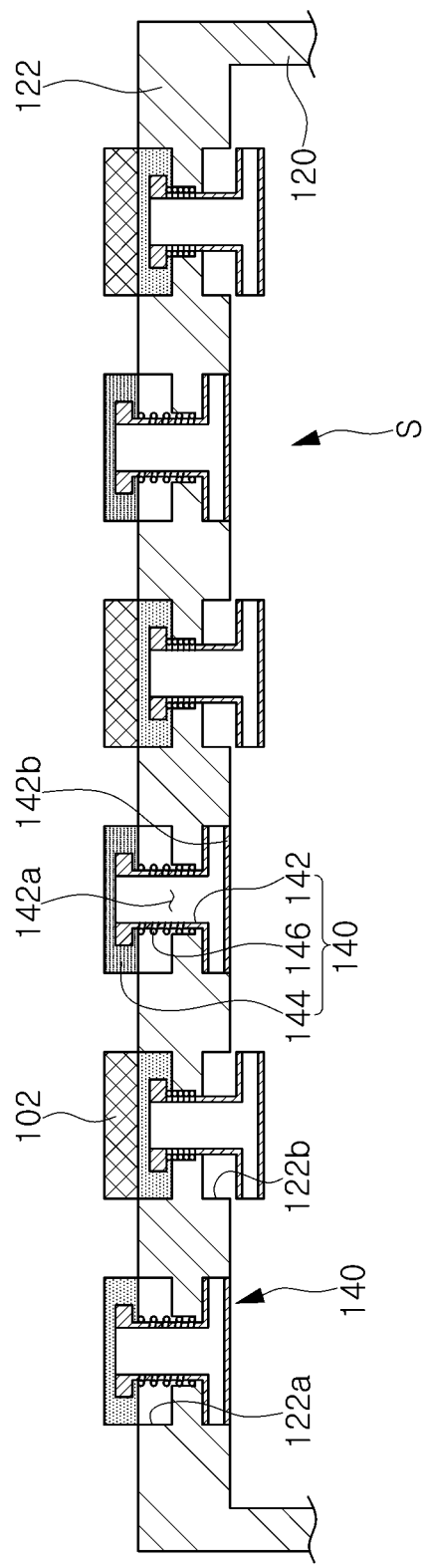

Then, as illustrated in FIG. 5, when the chip 102 is seated on the working die 120 (i.e., the contact portion 144 of the lifting member 140), the lifting member 140 in which the chip 102 is seated on the contact portion 144 of the lifting member 140 may be disposed to be lowered, and the lifting member 140 in which the chip 102 is not seated on the contact portion 144 of the lifting member 140 may be configured to protrude from the upper plate 122.

A state of the lifting member 140, in which the chip 102 is seated on the contact portion 144, will now be described. When the chip 102 is seated on the contact portion 144, the elastic member 146 may be compressed by a weight of the chip 102 to lower the body 142. When the body 142 is lowered, the contact portion 144 may be disposed to be inserted into the insertion groove 122a of the upper plate 122. In this case, the locking portion 142b of the body 142 is disposed to be spaced apart from the locking groove 122b. Accordingly, the flow path 142a opened to the side surface of the hooking portion 142b may be connected to the internal space S of the working die 120. Accordingly, adsorption force may be provided to the chip 102 through the flow path 142a of the body 142 and the flow path hole 144a of the contact portion 144. As a result, the chip 102 may be fixed to the upper surface of the contact portion 144.

The lifting member 140, on which the chip 102 is not seated, may be maintained in the state described above with reference to FIG. 4. Accordingly, as illustrated in FIG. 5, the top surfaces of the contact portion 144 of the plurality of lifting members 140 on which the chips 102 are not seated are substantially coplanar with the top surfaces of chips 102 that are seated on lifting members 140.

Figure 6:
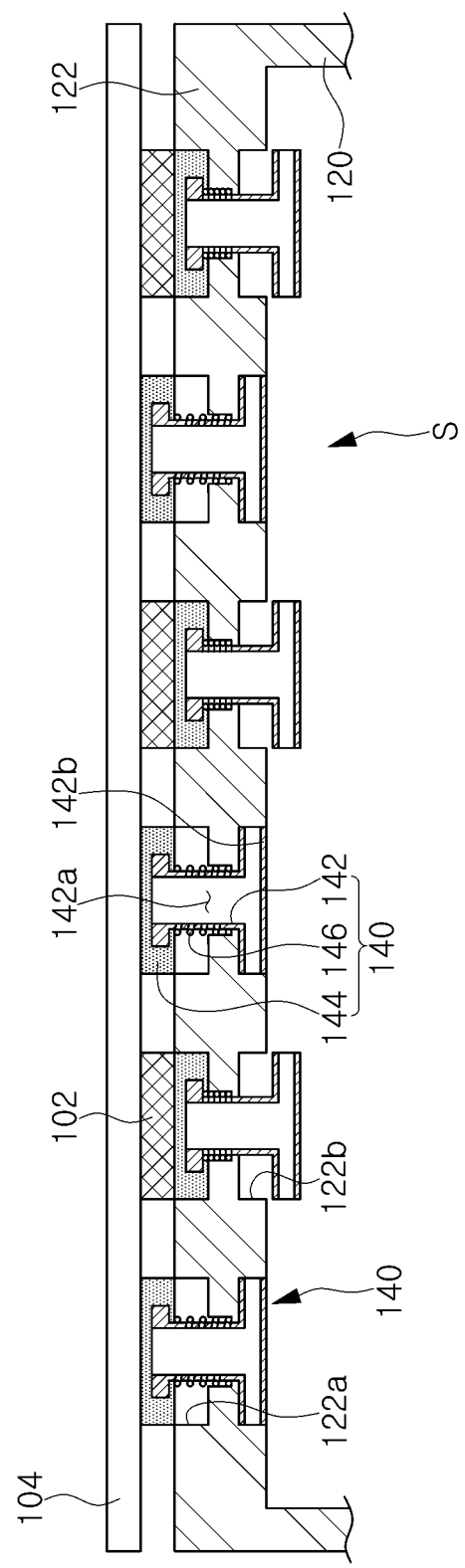

Then, as illustrated in FIG. 6, when the board 104 is disposed on the chip 102, the lifting member 140 on which the chip 102 is not disposed may support one surface of the board 104. In this case, the contact portion 144 of the lifting member 140 may support and be in contact with the bottom surface of the board 104, and the contact portion 144 may be supported by the elastic member 146 to support the bottom surface of the board 104 without being lowered. As further illustrated in FIG. 6, when the board 104 is disposed on the chip 102, the contact portion 144 of the lifting member 140 on which the chip 102 is disposed is not in contact with the bottom surface of the board 104 as a result of the chip 102 being disposed between the bottom surface of the board 104 and the contact portion 144. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Figure 7:
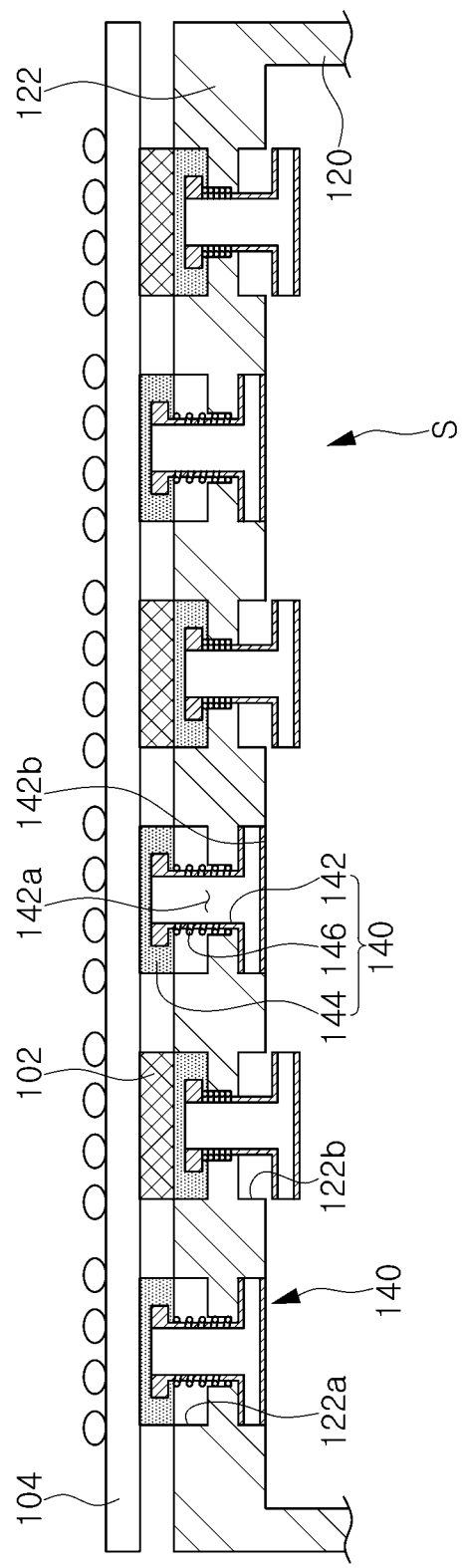

Then, as illustrated in FIG. 7, a solder ball attaching operation may be performed on the other surface of the board 104.

As described above, the bottom lower surface of the board 104 may be supported in the region, in which the chip 102 is not installed, through the lifting member 140, so that defects may be prevented from occurring without use of a dummy chip.

Figure 8:
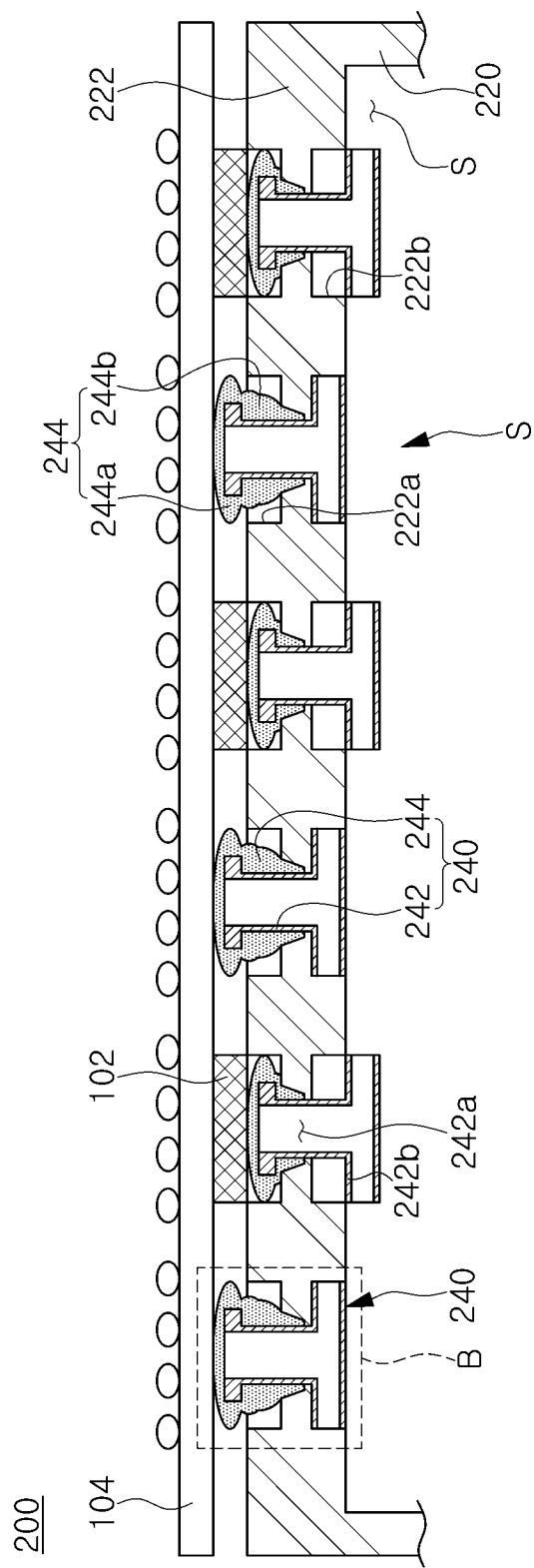
FIG. 8 is a view illustrating a configuration of a solder ball attaching apparatus according to an example embodiment.
Figure 9:
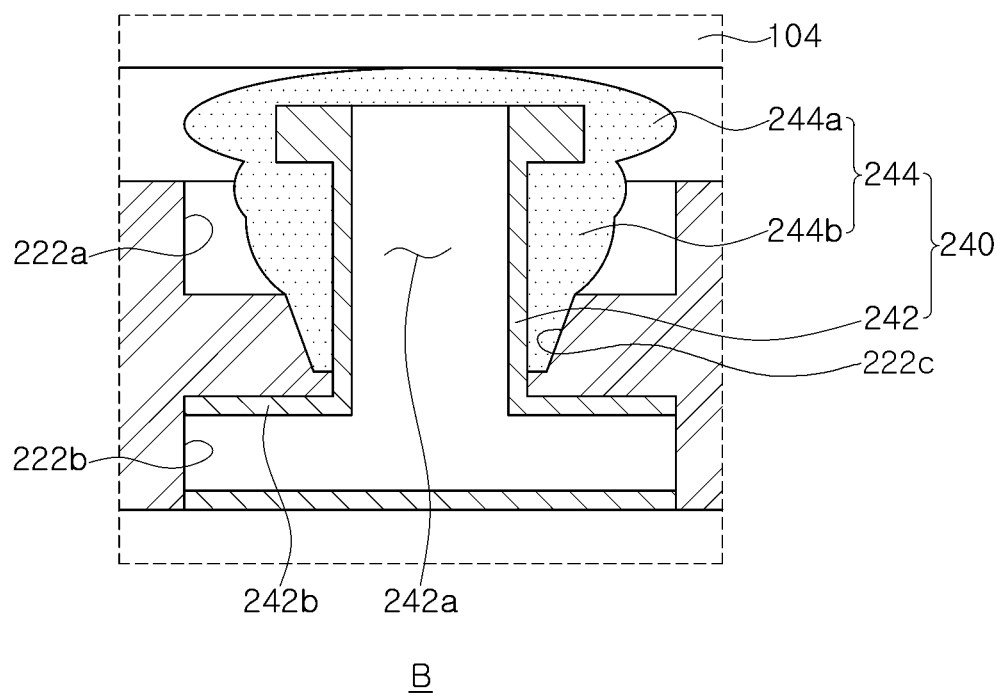
FIG. 9 is a view illustrating an enlarged configuration of a lifting member of the solder ball attaching apparatus according to the example embodiment of FIG. 8.

FIG. 8 is a view illustrating a configuration of a solder ball attaching apparatus according to an example embodiment, and FIG. 9 is a view illustrating an enlarged configuration of a lifting member of the solder ball attaching apparatus according to the example embodiment of FIG. 8.

Referring to FIGS. 8 and 9, a solder ball attaching apparatus 200 according to an example embodiment may include, for example, a working die 220 and a plurality of lifting members 240.

The working die 220 may have an internal space S. The internal space S of the working die 220 may be maintained in a vacuum state. When a chip 102 is seated on an upper plate 222 of the working die 220 through the vacuum formed in the internal space S of the working die 220, adsorption force may be provided to adsorb the chip 102. The plurality of lifting members 240 may be installed on the upper plate 222 of the working die 220. The upper plate 222 of the working die 220 may be provided with an insertion groove 222a and a locking groove 222b for installing the lifting member 240. As an example, the insertion groove 222a may be formed in an upper surface of the upper plate 222 and the locking groove 222b may be formed in a lower surface of the upper plate 222 to be disposed below the insertion groove 222a. The insertion groove 222a and the locking groove 222b may be connected to each other through a communication hole 222c. Accordingly, the lifting member 240 may be driven at the upper plate 222 to be movable upwardly and downwardly. A depth of the insertion groove 222a may corresponding to a thickness of the chip 102. This will be described in detail later.

The plurality of lifting members 240 may be installed on the working die 220. As an example, the lifting member 240 may be installed on the upper plate 222 of the working die 220 to be movable upwardly and downwardly. As an example, the lifting member 240 may include a body 242 and a contact portion 244.

The body 242 may be installed on the upper plate part 222 to be movable upwardly and downwardly, and may be provided with a flow path 242a such that the chip 102 may be fixed by the adsorption force through the vacuum of the internal space S of the working die 220. A lower end portion of the body 242 may be provided with a locking portion 242b inserted into the locking groove 222b of the upper plate 222 or spaced apart from the locking groove 222b. The flow path 242a may be opened to a side surface of the hooking portion 142b. The flow path 242a, opened to the side surface of the locking portion 242b, may be closed when the locking portion 242b is inserted into the locking groove 222b and may be opened when the locking portion 242b is separated from the locking groove 222b. Accordingly, adsorption force for fixing the chip 102 may be provided or the internal space S of the working die 220 may be prevented from being connected to an external entity. For example, when the lifting member 240 fixes the chip 102, the lifting member 240 may fix the chip 102 using the vacuum state of the internal space S of the working die 220. In addition, when the lifting member 240 supports the board 104, the internal space S of the working die 120 may be prevented from being connected to an external entity. More specifically, when the lifting member 240 fixes the chip 102, the locking portion 242b may be spaced apart from the locking groove 122b to open the flow path 242a. Accordingly, the chip 102 may be fixed by the lifting member 240 through the vacuum state of the internal space S of the working die 220 while the flow path 242a is opened. In addition, when the lifting member 240 supports a lower surface of the board 104, the locking portion 242b may be disposed to be inserted into the locking groove 222b to close the flow path 242a. Accordingly, the internal space S of the working die 220 may be prevented from being connected to the external entity, allowing the vacuum state of the internal space S of the working die 220 to be maintained.

Figure 10:
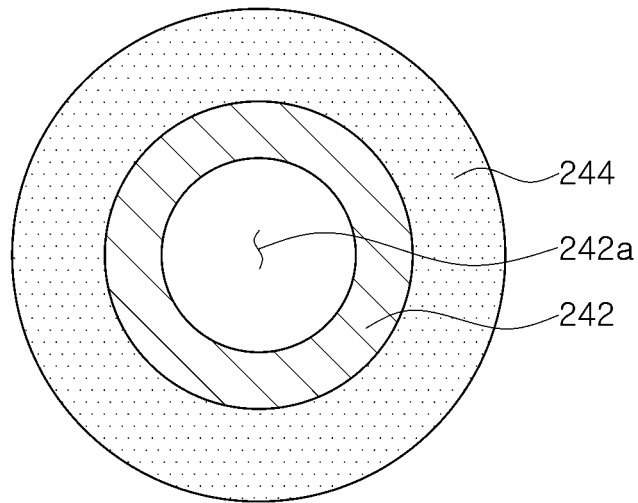
FIG. 10 is a plan view of a contact portion of the lifting member of the solder ball attaching apparatus according to the example embodiment of FIG. 8 when viewed from above.

The contact portion 244 may be disposed in an upper end portion of the body 242. As illustrated in FIG. 10, the contact portion 244 may have a circular shape when viewed from above. In addition, the contact portion 244 may be inserted into the insertion groove 222a when the body 242 is lowered by the chip 102. To this end, the insertion groove 222a may have a shape corresponding to the shape of the contact portion 244, and the insertion groove 222a and the contact portion 244 may have sizes and shapes allowing the insertion groove 222a to be closed by the contact portion 244 when the contact portion 244 is inserted into the insertion groove 222a.

As an example, the contact portion 244 may include a plate 244a, having a substantially circular plate shape, and an elastic wall 244b extending downwardly from the plate 244a. The flow path 242a provided in the body 242 may be opened to an upper surface of the plate 244a. Accordingly, when the chip 102 is seated on the upper surface of the plate 244a, the chip 102 may be fixed to the plate 244a through the vacuum state of the internal space S of the working die 220. The elastic wall 244b may be compressed when the chip 102 is seated on the working die 220 (i.e., the upper surface of the plate 244a), and may be extended by restoring force when the chip 102 is not seated on the working die 220 (i.e., the upper surface of the plate 244a), so that the plate 244a may be disposed to be spaced apart from the die 220.

Since the insertion groove 222a has a depth corresponding to a thickness of the chip 102, a height to which the lifting member 240 is lifted may be regulated by the depth of the insertion groove 222a. Therefore, the lower surface of the board 104 may be more stably supported by the contact portion 244 of the lifting member 240.

As described above, the lower surface of the board 104 may be supported in the region, in which the chip 102 is not installed, through the lifting member 240, so that defects be prevented from occurring without use of a dummy chip. For example, when the board 104 is disposed on the chip 102, the lifting member 240 on which the chip 102 is not disposed may support one surface of the board 104. In this case, the contact portion 244 of the lifting member 240 may support and be in contact with the bottom surface of the board 104, and the contact portion 244 may be supported by the elastic wall 244b to support the bottom surface of the board 104 without being lowered. Further, when the board 104 is disposed on the chip 102, the contact portion 244 of the lifting member 240 on which the chip 102 is disposed is not in contact with the bottom surface of the board 104 as a result of the chip 102 being disposed between the bottom surface of the board 104 and the contact portion 244. Moreover, as illustrated in FIG. 8, the top surfaces of the contact portion 244 of the plurality of lifting members 240 on which the chips 102 are not seated are substantially coplanar with the top surfaces of chips 102 that are seated on lifting members 240.

Figure 11:
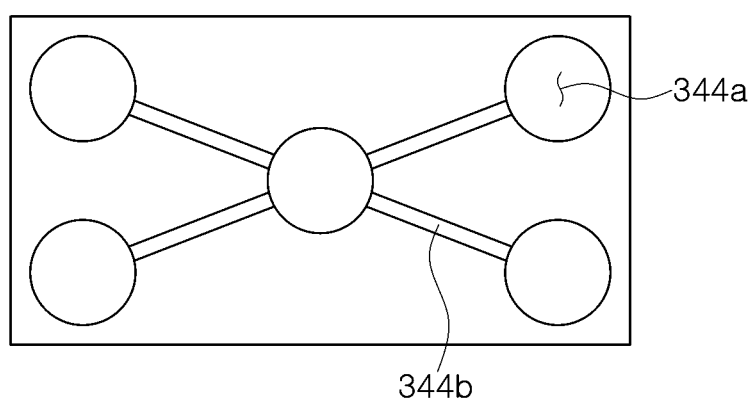
FIG. 11 is a plan view of a contact portion of a lifting member of a solder ball attaching apparatus according to an example embodiment when viewed from above.

FIG. 11 is a plan view of a contact portion of a lifting member of a solder ball attaching apparatus according to an example embodiment when viewed from above.

Referring to FIG. 11, an upper surface of a contact portion 344 may be provided with a plurality of flow path holes 344a, and flow path holes 344a provided in a central portion may be connected to the flow path holes 344a disposed therearound through a connection hole 344b having a straight line (e.g., linear) shape. Accordingly, adsorption force applied by the plurality of flow path holes 344a may be equally distributed.

As described above, a solder ball attaching apparatus for preventing contamination of a working tool and a failure in positioning of a solder ball, caused by warpage of a board, even when a solder ball attaching operation is performed on the board without providing a dummy chip, may be provided.

While example embodiments have been shown and described above, it will be apparent to those skilled in the art that modifications and variations could be made without departing from the scope of the aspects of the present inventive concept as defined by the appended claims.

What is claimed is:

1. A fixing apparatus comprising:
   a working die including an upper plate including a plurality of insertion grooves and a plurality of locking grooves, the working die having an internal space maintained in a vacuum state; and
   a plurality of lifting members installed on the upper plate to be movable upwardly and downwardly, the lifting members include
      a body including a lower end portion provided with a locking portion inserted into a locking groove among the plurality of locking grooves or disposed to be spaced apart from the locking groove and in which a flow path is formed to provide adsorption force, generated by the vacuum state of the internal space of the working die, and
      a contact portion installed to be fixed to an upper end portion of the body,
   wherein, when the lifting member is lowered, the upper end portion is inserted into the insertion groove and a top surface of the contact portion is coplanar with a top surface of the upper plate, and
   wherein, when the lifting member is raised, the lower end portion is inserted into the locking groove and a bottom surface of the lower end portion is coplanar with a bottom surface of the upper plate, and
   wherein the lifting member is lowered by a chip when the chip is seated on the lifting member and is raised by elastic restoring force when the chip is removed.

2. The fixing apparatus of claim 1, further comprising:
an elastic member having one end, supported on a lower surface of the contact portion, and the other end supported on the upper plate to provide restoring force to the body.

3. The fixing apparatus of claim 2, wherein
the upper plate is provided with a communication hole connecting the insertion groove and the locking groove to each other, and
the other end of the elastic member is supported on a locking projection disposed to protrude from the communication hole.

4. The fixing apparatus of claim 1, wherein
the contact portion is provided with a flow path hole connected to the flow path.

5. The fixing apparatus of claim 1, wherein
the flow path is opened to a side surface of the locking portion, and
the flow path is closed when the locking portion is inserted into the locking groove and is opened when the locking portion is disposed to be spaced apart from the locking groove.

6. The fixing apparatus of claim 1, wherein
the insertion groove has a depth corresponding to a thickness of the chip.

7. The fixing apparatus of claim 1, wherein
the contact portion comprises a plate, having a plate shape, and an elastic wall extending downwardly from the plate, and
the body is raised or lowered according to expansion or contraction of the elastic wall.

8. The fixing apparatus of claim 7, wherein
the insertion groove has a depth corresponding to a thickness of the chip.

9. The fixing apparatus of claim 7, wherein
the flow path is opened to an upper surface of the contact portion.

10. The fixing apparatus of claim 7, wherein
the flow path is opened to a side surface of the locking portion, and the flow path is closed when the locking portion is inserted into the locking groove and is opened when the locking portion is disposed to be spaced apart from the locking groove.

11. A fixing apparatus comprising:

a working die having an internal space maintained in a vacuum state; and a plurality of lifting members installed on the working die to be movable upwardly and downwardly by elastic force, wherein each of the lifting members include a body including a lower end portion provided with a locking portion, a contact portion fixed to an upper end portion of the body, and a flow path within the body that provides an adsorption force generated by the vacuum state of the internal space of the working die, wherein the flow path is opened or closed according to raising or lowering of the lifting member to provide adsorption force through connection to the internal space of the working die maintained in the vacuum state, wherein the working die is provided with an upper plate on which the lifting members are installed, the upper plate is provided with an insertion groove, into which an upper end portion of the lifting member is inserted when the lifting member is lowered, and a locking groove into which the locking portion of the lifting member is inserted when the lifting member is raised, and the lifting member is lowered by a chip when the chip is seated on the lifting member and is raised by elastic restoring force when the chip is removed, and wherein the locking portion is disposed apart from the locking groove when the lifting member is lowered.

12. The fixing apparatus of claim 11, further comprising:

an elastic member having one end, supported on a lower surface of the contact portion, and the other end supported on the upper plate to provide restoring force to the body.

13. The fixing apparatus of claim 12, wherein the upper plate is provided with a communication hole connecting the insertion groove and the locking groove to each other, and the other end of the elastic member is supported on a locking projection disposed to protrude from the communication hole.

14. The fixing apparatus of claim 11, wherein the contact portion is provided with a flow path hole connected to the flow path.

15. The fixing apparatus of claim 11, wherein the flow path is opened to a side surface of the locking portion, and the flow path is closed when the locking portion is inserted into the locking groove and is opened when the locking portion is disposed to be spaced apart from the locking groove.

16. The fixing apparatus of claim 11, wherein the insertion groove has a depth corresponding to a thickness of the chip.

17. The fixing apparatus of claim 11, wherein the contact portion comprises a plate, having a plate shape, and an elastic wall extending downwardly from the plate, and the body is raised or lowered according to expansion or contraction of the elastic wall.

* * * * *